(12) United States Patent  
Goel

(10) Patent No.: US 9,651,621 B2  
(45) Date of Patent: May 16, 2017

(54) SYSTEM FOR AND METHOD OF SEMICONDUCTOR FAULT DETECTION

(71) Applicant: TAIWAN SEMICONDUCTOR MANUFACTURING COMPANY, LTD., Hsinchu (TW)

(72) Inventor: Sandeep Kumar Goel, Dublin, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 88 days.

(21) Appl. No.: 14/328,372

(22) Filed: Jul. 10, 2014

(65) Prior Publication Data

US 2016/0011257 A1    Jan. 14, 2016

(51) Int. Cl.
*G06F 11/22* (2006.01)
*G06F 17/50* (2006.01)
*G01R 31/3183* (2006.01)

(52) U.S. Cl.
CPC .................. *G01R 31/318342* (2013.01)

(58) Field of Classification Search
USPC ........ 716/103, 112, 136; 714/726, 738, 739, 714/741

See application file for complete search history.

(56) References Cited

U.S. PATENT DOCUMENTS

| | | | | |
|---|---|---|---|---|
| 6,026,222 | A * | 2/2000 | Gupta | G06F 17/504 716/103 |
| 6,151,694 | A * | 11/2000 | Nozuyama | G01R 31/31835 714/724 |
| 6,519,609 | B1 * | 2/2003 | Touzet | G06F 17/505 707/999.102 |
| 7,971,119 | B2 * | 6/2011 | Hsu | G01R 31/31854 714/726 |
| 2015/0347664 | A1 * | 12/2015 | Goel | G06F 17/5009 716/112 |

* cited by examiner

*Primary Examiner* — Brian Ngo  
(74) *Attorney, Agent, or Firm* — Hauptman Ham, LLP

(57) ABSTRACT

A method of detecting one or more faults in a semiconductor device that includes generating one or more secondary node lists from a primary node list. The primary node list includes one or more nodes. Each node of the one or more nodes of the primary node list is associated with a corresponding secondary node list of the one or more secondary node lists. The method also includes generating a test pattern set from the secondary node list and a fault list. The fault list identifies one or more faults.

20 Claims, 11 Drawing Sheets

| A | B | C | D | E | F | G | H | I | Faults Tested |
|---|---|---|---|---|---|---|---|---|---|
| 1 | 1 | 1 | 0 | X | X | 1 | 0 | 1 | A0, B0, C0, G0 |
| 0 | X | X | 1 | 1 | 1 | 0 | 1 | 1 | D0, E0, F0, H0 |

SYSTEM FOR AND METHOD OF SEMICONDUCTOR FAULT DETECTION

BACKGROUND

The recent trend in miniaturizing integrated circuits (ICs) has resulted in smaller devices which consume less power, yet provide more functionality at higher speeds than before. The miniaturization process has also resulted in stricter design and manufacturing specifications. Various electronic design automation (EDA) tools are developed to generate, optimize and verify designs for semiconductor devices while ensuring that the design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
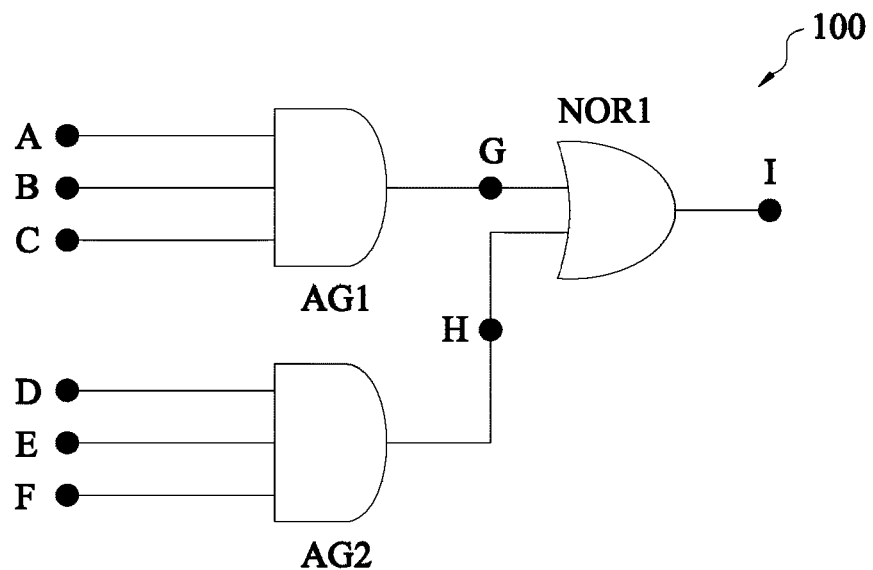
FIG. 1A is a schematic diagram of a semiconductor device in accordance with some embodiments.
FIG. 1B is a table of one or more test patterns of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the design of an integrated circuit, fault testing is performed to detect one or more faults. A fault is an abnormal condition or defect in a semiconductor device. A test pattern is an ordered list of inputs and expected outputs of one or more semiconductor devices being tested for faults according to one or more fault models. In some embodiments, one or more faults are detected in a semiconductor device by applying one or more test pattern sets to the semiconductor device. In some embodiments, one or more test patterns are utilized to detect defects where a large defect density is observed in the semiconductor device when compared with other regions (e.g., lower defect density regions).

FIG. 1A is a schematic diagram of a semiconductor device 100 in accordance with some embodiments. Semiconductor device 100 includes AND gate AG1, AND gate AG2, and NOR gate NOR1. Semiconductor device 100 includes nodes A, B, C, D, E, F, G, H and I. A node is a portion of a circuit where two or more circuit elements are configured to meet or be connected, at an output port of a circuit element or an input port of a circuit element.

AND gate AG1 is connected to NOR gate NOR1 by node G. AND gate AG1 is connected to one or more external circuit elements (not shown) by nodes A, B and C. The input of AND gate AG1 is configured to receive an input signal by nodes A, B and C. The output of AND gate AG1 is configured to send an output signal to NOR gate NOR1 by node G.

AND gate AG2 is connected to NOR gate NOR1 by node H. AND gate AG2 is connected to one or more external circuit elements (not shown) by nodes D, E and F. The input of AND gate AG2 is configured to receive an input signal by nodes D, E and F. The output of AND gate AG2 is configured to send an output signal to NOR gate NOR1 by node H.

NOR gate NOR1 is connected to an external circuit element (not shown) by node I. The output of NOR gate NOR1 is configured to send an output signal by node I.

FIG. 1B is a table of one or more test patterns 100' of semiconductor device 100 in accordance with some embodiments. Test pattern 100' includes a test pattern set 106. Test pattern set 106 includes a first test pattern 102 and a second test pattern 104. A test pattern is an ordered list of inputs and expected outputs of one or more semiconductor devices being tested for faults according to one or more fault models. A test pattern is created by an automated test pattern generator (ATPG). A test pattern set includes one or more test patterns.

A fault is an abnormal condition or defect in a semiconductor device and may affect the operation of the semiconductor device. A fault may be resistive open circuits, resistive short circuits, conductive line edge roughness or residues, high resistive contacts and vias or copper pits. Faults may be caused by process variations, power-supply noise, cross talk, and rule violations related to design for manufacturability (DfM), such as butted contacts and insufficient via enclosures.

First test pattern 102 includes an input sequence (e.g., 1 1 1 0 x x 1 0) applied to nodes A, B, C, D, E, F, G, H, an output sequence output by node I (e.g., 1) and faults tested (e.g., A0, B0, C0 and G0). In this example, first test pattern 102 is a test pattern for a stuck-at-zero fault model for circuit 100. For example, if the input sequence (e.g., 1 1 1) is applied to nodes A, B and C, then the expected output of node G is a logical high (e.g., 1). However, for a stuck-at-zero implementation, one of the input sequence entries (e.g., 1 1 1) applied to nodes A, B and C is changed to include one or more logical lows (e.g., 0). In this example, the output sequence of the AND gate AG1 is also changed to a logical low (e.g. 0). In this example, one or more faults are tested at nodes A, B, C and G (shown as A0, B0, C0 and G0) by first test pattern 102.

Second test pattern 104 includes an input sequence (e.g., 0 x x 1 1 1 0 1) applied to nodes A, B, C, D, E, F, G, H, an output sequence output by node I (e.g., 1) and faults tested (e.g., D0, E0, F0 and H0). In this example, second test pattern 104 is a test pattern for a stuck-at-zero fault model for circuit 100. For example, if the input sequence (e.g., 1 1 1) is applied to nodes D, E and F, then the expected output of node H is a logical high (e.g., 1). However, for a stuck-at-zero implementation, one of the input sequence entries (e.g., 1 1 1) applied to nodes D, E and F is changed to include one or more logical lows (e.g., 0). In this example, the output sequence of the AND gate AG2 is also changed to a logical low (e.g. 0). In this example, one or more faults are tested at nodes D, E, F and H (shown as D0, E0, F0 and H0) by second test pattern 104.

Figure 2:
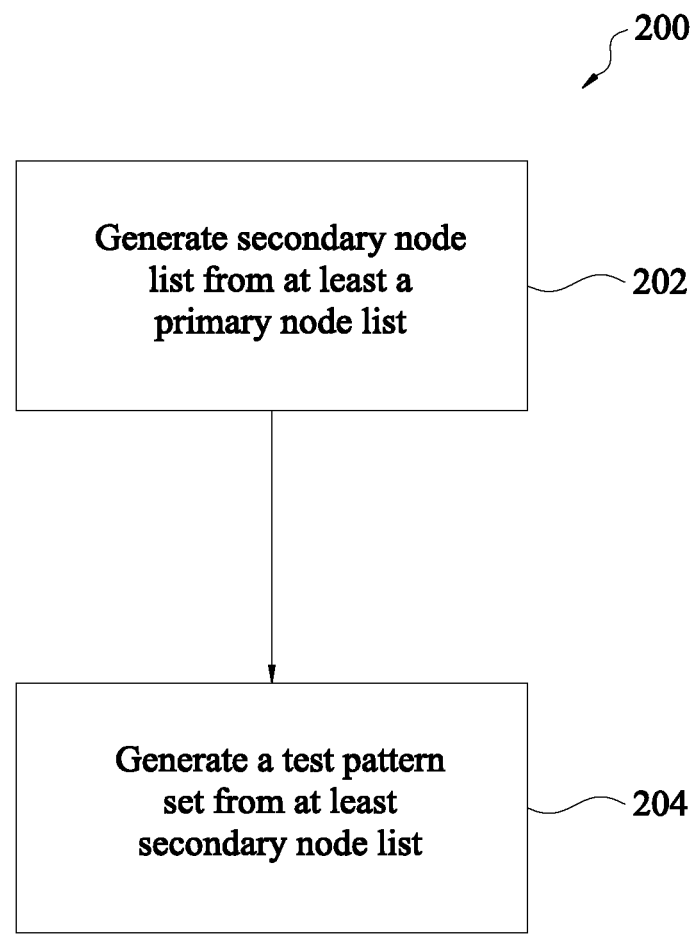
FIG. 2 is a flow chart of a method of detecting one or more faults in a semiconductor device in accordance with some embodiments

FIG. 2 is a flow chart of a method 200 of detecting one or more faults in a semiconductor device in accordance with some embodiments. In some embodiments, the method 200 is implemented as a software application including computer program code for execution by a processor that is used by an EDA tool. Method 200 begins with operation 202, in which a system for detecting faults in a semiconductor device generates one or more secondary node lists from at least a primary node list. The primary node list includes one or more nodes. Each node of the one or more nodes in the primary node list is associated with a corresponding secondary node list of the one or more secondary node lists.

In some embodiments, each secondary node list includes a node selected from the primary node list. In some embodiments, each secondary node list includes one or more nodes from the primary node list within a predetermined distance of the selected node. Each secondary node list includes one or more adjacent nodes from the primary node list. An adjacent node is a node within a predetermined distance of one or more other nodes in the primary node list. Each secondary node list includes one or more neighboring nodes in the primary node list. A neighboring node is a node within a predetermined distance of one or more other nodes in the primary node list. In some embodiments, the primary node list is derived from one or more netlists. In some embodiments, a netlist includes node information of a semiconductor device. In some embodiments, a netlist includes a voltage, a current or node information of a semiconductor device.

In operation 204, the system for detecting faults in a semiconductor device generates a test pattern set from at least the secondary node list. The test pattern set includes one or more test patterns. In some embodiments, each test pattern of the test pattern set includes one or more ordered lists of inputs to the semiconductor device and one or more ordered lists of expected outputs of the semiconductor device, where each ordered list of inputs of the one or more ordered lists of inputs corresponds to each ordered list of expected outputs of the one or more ordered lists of expected outputs. In some embodiments, the test pattern set is generated from a fault list. A fault list includes one or more faults. In some embodiments, the test pattern set is generated from a primary node list and a fault list. Each test pattern of the one or more test patterns is arranged to cause the detection of at least one fault from the fault list.

A fault list is a list of one or more faults generated by a particular fault model when the model is applied to one or more of the nodes in a semiconductor device being tested. In some embodiments, the fault list includes coordinate data of a physical layout that is associated with one or more faults.

Fault models are utilized to test different types of defects in a semiconductor device. In some embodiments, a fault model includes a line stuck-at fault model, transition fault model, bridging fault model, path delay fault model, and other similar models.

The test pattern set includes one or more test patterns based on the secondary node list. In some embodiments, the test pattern set includes one or more test patterns that detect faults where a large defect density is observed in the semiconductor device when compared with other regions (e.g., lower defect density regions). In some embodiments, the test pattern set targets regions of the semiconductor device where clustered defects are observed in neighbor nodes. In some embodiments, the test pattern set includes one or more test patterns based on neighborhood excitation and propagation. In some embodiments, the test pattern set is correlated to one or more test patterns based on the neighbor nodes contained in each secondary node list.

Figure 3:
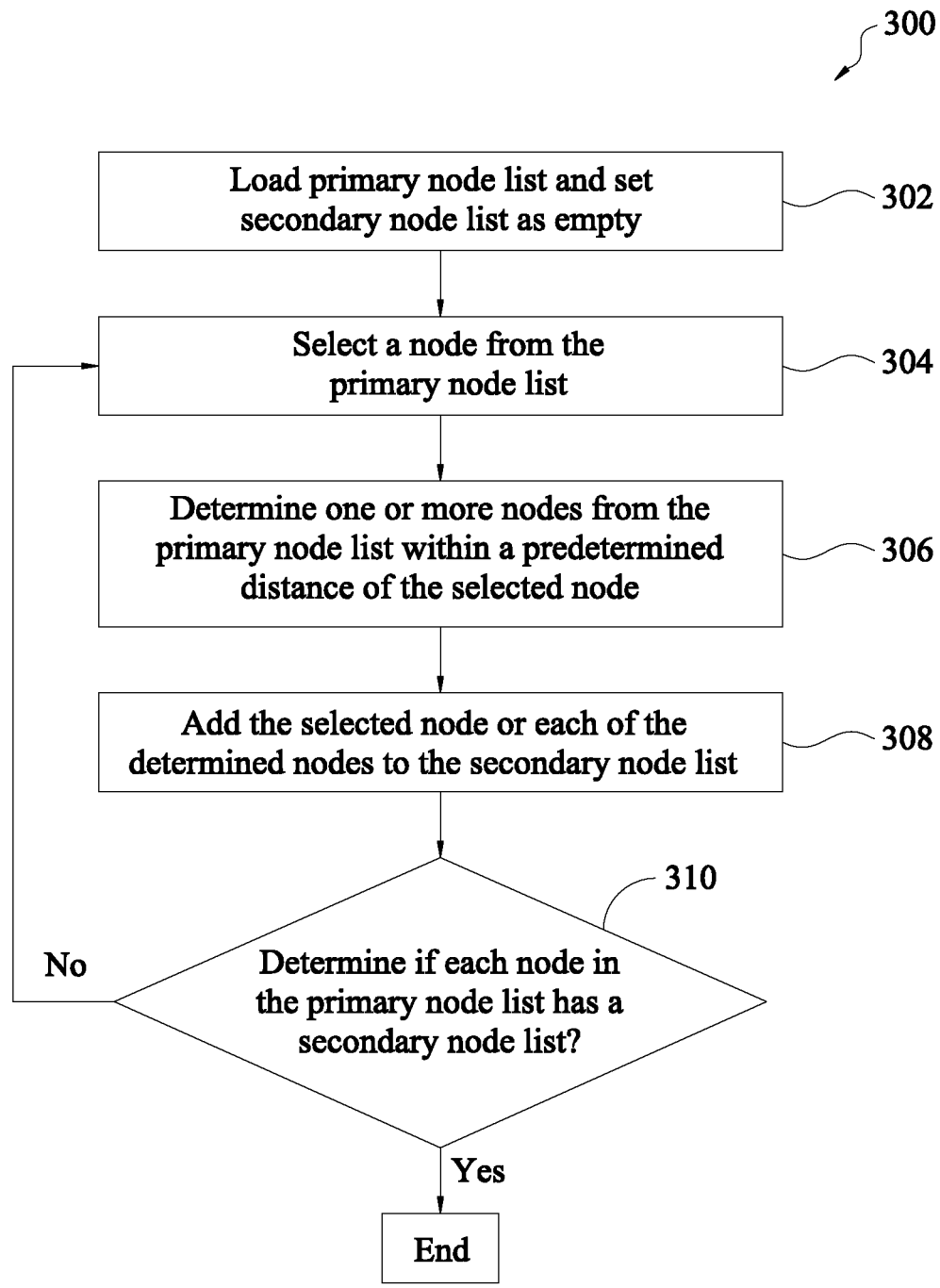
FIG. 3 is a flow chart of a method of generating a secondary node list in a semiconductor device in accordance with some embodiments.

FIG. 3 is a flow chart of a method 300 of generating a secondary node list in a semiconductor device in accordance with some embodiments. Method 300 is an embodiment of operation 202 shown in FIG. 2. Method 300 begins with operation 302 in which a primary node list is loaded into a fault detection tool and sets the secondary node list for each of the nodes in the primary node list equal to an empty set. In some embodiments, the fault detection tool is computer program code in a portion of an EDA tool. In some embodiments, the secondary node list for each of the nodes in the primary node list includes one or more data values that are configured to be overwritten.

In operation 304, the system for detecting faults in a semiconductor device selects a node from the primary node list. A node from the primary node list with an empty secondary node list is selected.

In operation 306, the system for detecting faults in a semiconductor device determines one or more nodes from the primary node list within a predetermined distance of the selected node. The predetermined distance is a physical distance. In some embodiments, the predetermined distance is entered by a user. In some embodiments, the predetermined distance is adjusted by a user. In some embodiments, the one or more determined nodes from the primary node list that are within a predetermined distance of the selected node correspond to neighboring nodes of the selected node. In some embodiments, the predetermined distance is bounded by a corresponding predetermined drawing shape (as shown in method 400).

In operation 308, the system for detecting faults in a semiconductor device adds the selected node or each of the determined nodes of the primary node list (within a predetermined distance of the selected node) to the secondary node list for the corresponding selected node. In some embodiments, the system for detecting faults in a semiconductor device adds the selected node and each of the determined nodes of the primary node list (within a predetermined distance of the selected node) to the secondary node list for the corresponding selected node. Each of the determined nodes of the primary node list corresponds to nodes matching the predetermined distance criteria of the selected node. In some embodiments, the system for detecting faults in a semiconductor device adds the selected node and the corresponding neighboring nodes to the secondary node list for the corresponding selected node.

In operation 310, the system for detecting faults in a semiconductor device determines if each node in the primary node list has a corresponding secondary node list. If the system for detecting faults in a semiconductor device determines that each node in the primary node list does not have a corresponding secondary node list, the operation proceeds to operation 304 for the next node in the primary node list. If the system for detecting faults in a semiconductor device determines each of the nodes in the primary node list has a corresponding secondary node list, the operation ends. For operation 310, determining if each node in the primary node list has a corresponding secondary node list includes determining if one or more secondary node lists includes an empty set. If the system for detecting faults in a semiconductor device determines that one or more secondary node lists include an empty set, the operation proceeds to operation 304. If the system for detecting faults in a semiconductor device determines that each of the secondary node lists do not have an empty set, the operation proceeds to operation 204.

Figure 4A:
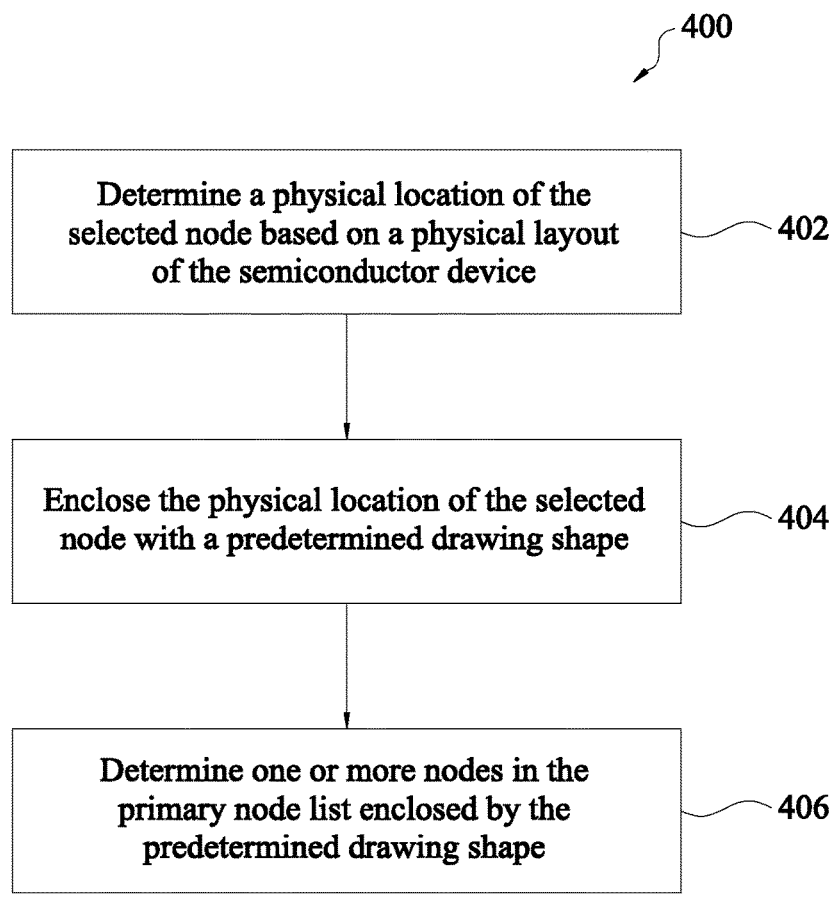
FIG. 4A is a flow chart of a method of determining one or more nodes in the primary node list within a predetermined distance of the selected node in a semiconductor device in accordance with some embodiments.

FIG. 4A is a flow chart of a method 400 of determining one or more nodes in the primary node list within a predetermined distance of the selected node in a semiconductor device in accordance with some embodiments. Method 400 is an embodiment of operation 306 shown in FIG. 3. Method 400 begins with operation 402 in which the system for detecting faults in a semiconductor device determines a physical location of the selected node based on a physical layout of the semiconductor device.

The physical location of the selected node is the corresponding coordinates of the selected node based on the physical layout. In some embodiments, the physical layout is generated by an EDA tool. In some embodiments, the physical layout is generated by a fault detection tool. In some embodiments, the EDA tool which generates the physical layout is the same EDA tool which implements methods 200, 300 or 400. In some embodiments, the EDA tool which generates the physical layout is different from the EDA tool which implements methods 200, 300 or 400.

In operation 404, the system for detecting faults in a semiconductor device encloses the physical location of the selected node with a predetermined drawing shape. In some embodiments, the predetermined drawing shape is a polygon. In some embodiments, the predetermined drawing shape is a rectangle. In some embodiments, the predetermined drawing shape is a square. In some embodiments, the predetermined drawing shape is a circle. In some embodiments, the predetermined drawing shape is an ellipse. In some embodiments, a size of the predetermined drawing shape is adjusted. In some embodiments, a size of the predetermined drawing shape is fixed. In some embodiments, a shape of the predetermined drawing shape is adjusted. In some embodiments, a shape of the predetermined drawing shape is fixed. In some embodiments, a shape of the predetermined drawing shape is asymmetric. In some embodiments, a shape of the predetermined drawing shape is symmetric.

In operation 406, the system for detecting faults in a semiconductor device determines one or more nodes in the primary node list enclosed by the predetermined drawing shape. In FIG. 4A, the one or more nodes in the primary node list enclosed by the predetermined drawing shape include the selected node and the corresponding neighboring nodes. In some embodiments, the one or more nodes in the primary node list enclosed by the predetermined drawing shape include the secondary node list associated with the selected node. In some embodiments, if the predetermined drawing shape intersects a physical coordinate location of a node, then the intersecting node is included in the secondary node list. In some embodiments, if the predetermined drawing shape intersects the physical coordinate location of a node, then the intersecting node is not included in the secondary node list.

Figure 4B:
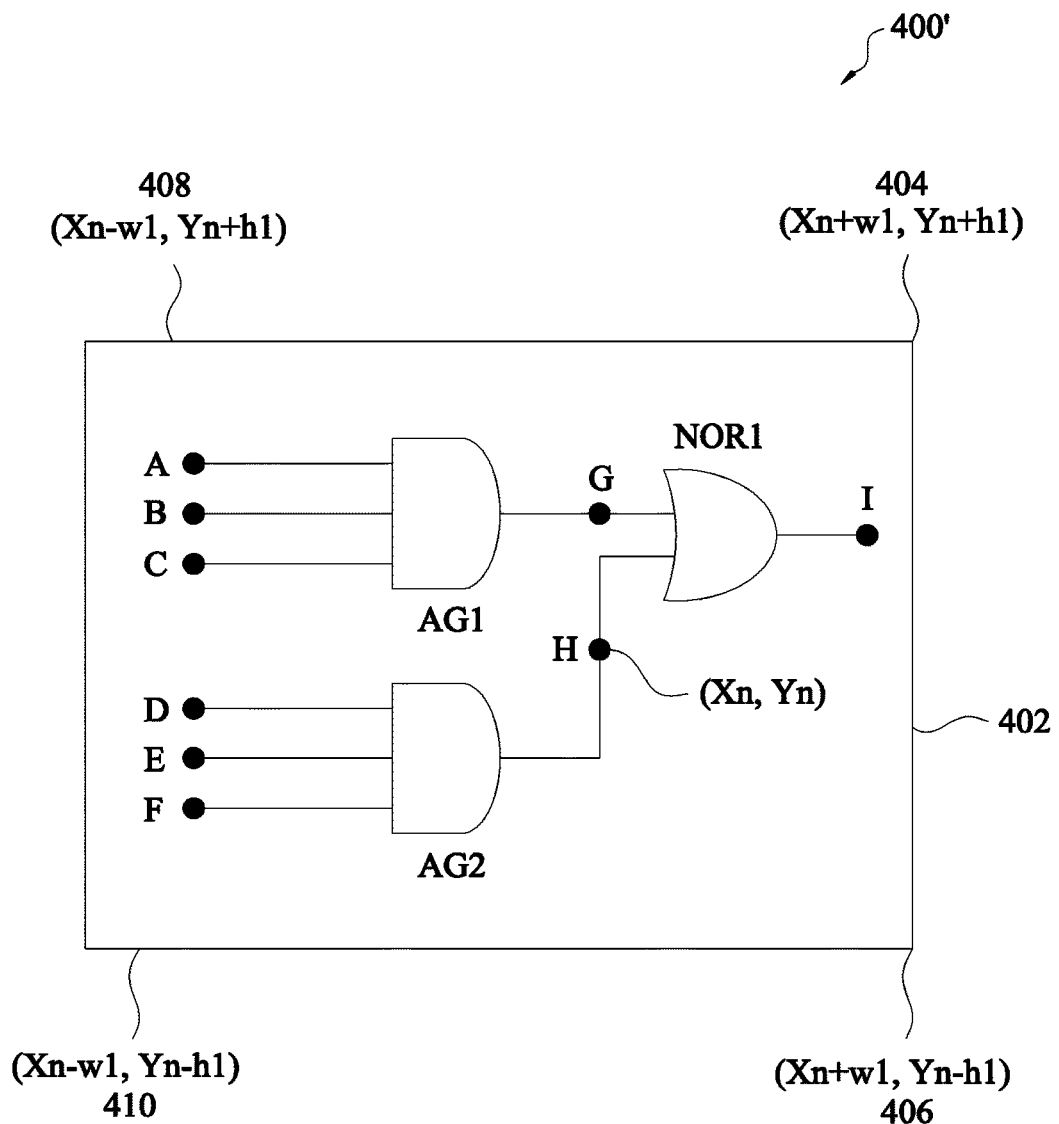
FIG. 4B is a schematic diagram of a semiconductor device in accordance with some embodiments.

FIG. 4B is a schematic diagram of a semiconductor device, e.g., semiconductor device 400', after execution of method 400 in accordance with some embodiments. Semiconductor device 400' is an embodiment of the semiconductor device 100 shown in FIG. 1A. In comparison with FIG. 1A, FIG. 4B also includes predetermined drawing shape 402.

Predetermined drawing shape 402 is bounded by coordinate locations 404, 406, 408 and 410. In some embodiments, the center of the predetermined drawing shape 402 corresponds to the physical location of node H (e.g., Xn, Yn), which is the selected node of operation 304. In some embodiments, the physical location of node H (e.g., Xn, Yn) corresponds to any region within the predetermined drawing shape 502.

Coordinate location 404 has a physical location of Xn+w1, Yn+h1, where w1 is the half-width of predetermined drawing shape 402 and h1 is a half-height of predetermined drawing shape 402. Coordinate location 406 has a physical location of Xn+w1, Yn−h1, where w1 is the half-width of predetermined drawing shape 402 and h1 is a half-height of predetermined drawing shape 402. Coordinate location 408 has a physical location of Xn−w1, Yn+h1, where w1 is the half-width of predetermined drawing shape 402 and h1 is a half-height of predetermined drawing shape 402. Coordinate location 410 has a physical location of Xn−w1, Yn−h1, where w1 is the half-width of predetermined drawing shape 402 and h1 is a half-height of predetermined drawing shape 402.

The width w of the predetermined drawing shape 402 can be expressed by formula 1 and the height h of the predetermined drawing shape 402 can be expressed by formula 2:

$$w = 2 * w1 \tag{1}$$

$$h = 2 * h1 \tag{2}$$

where w is the width of the predetermined drawing shape 402, h is the height of the predetermined drawing shape 402, w1 is the half-width of the predetermined drawing shape 402 and h1 is the half-height of the predetermined drawing shape 402.

In some embodiments, form formulas 1 or 2 are expressed in Cartesian coordinates (as shown in formulas 1 and 2). In some embodiments, formulas 1 or 2 are expressed in other coordinate systems such as cylindrical and spherical. In some embodiments, the width of the predetermined drawing shape 402 is substantially equal to the height of the predetermined drawing shape 402. In some embodiments, the width of the predetermined drawing shape 402 is not equal to the height of the predetermined drawing shape 402.

Predetermined drawing shape 402 encloses AND gate AG1, AND gate AG2 and NOR gate NOR1. Predetermined drawing shape 402 encloses nodes A, B, C, D, E, F, G, H and I. In this example, the secondary node list includes each of the nodes enclosed by the predetermined drawing shape 402 (e.g., nodes A, B, C, D, E, F, G, H and I). In this example, node H is a primary node and nodes A, B, C, D, E, F, G and I are secondary nodes (e.g., neighbor nodes). In this example, the secondary node list of the primary node (e.g., node H) includes nodes A, B, C, D, E, F, G, H and I.

Figure 5A:
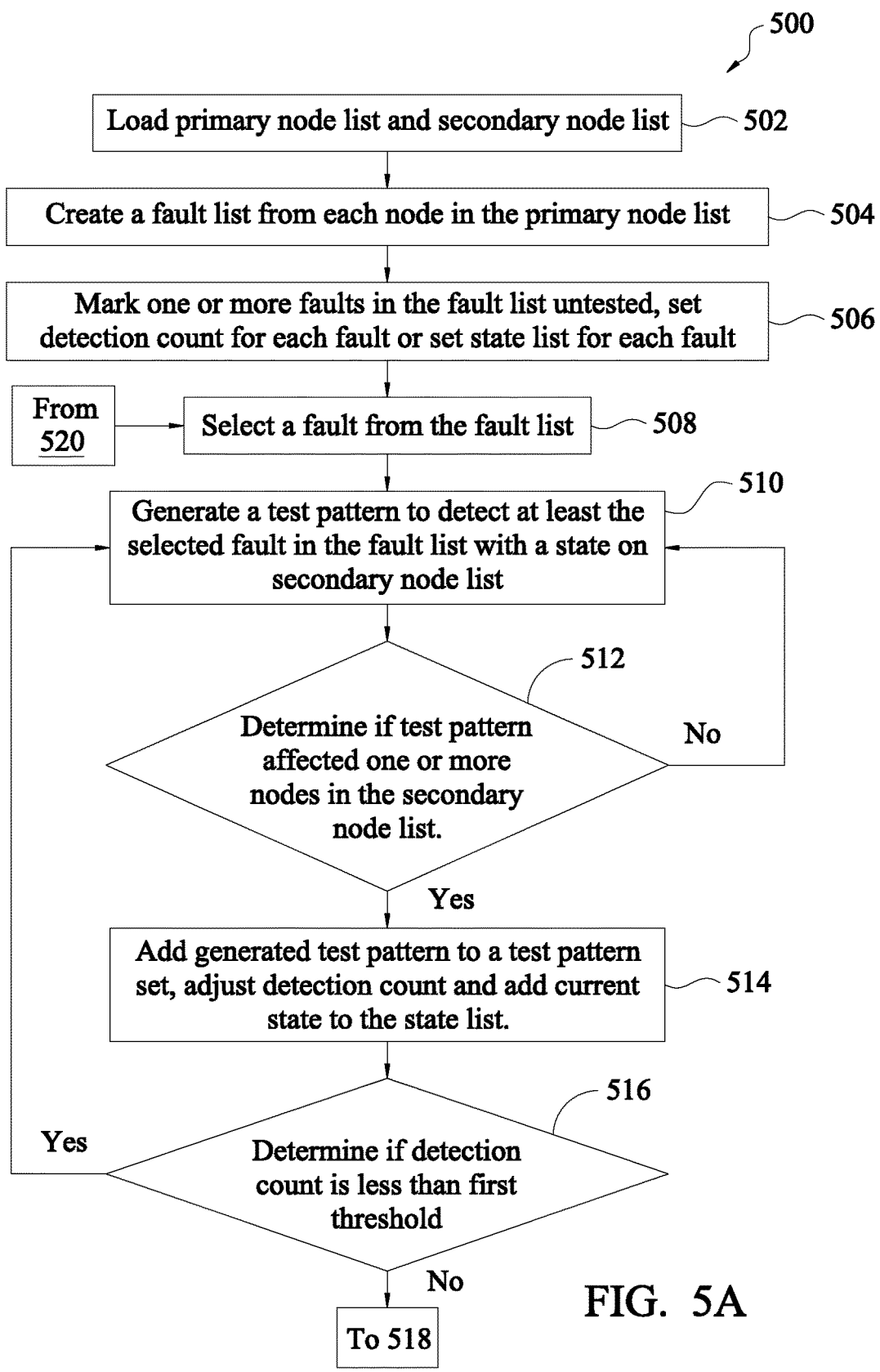
FIG. 5A is a flow chart of a method of generating a test pattern set in a semiconductor device in accordance with some embodiments.
Figure 5B:
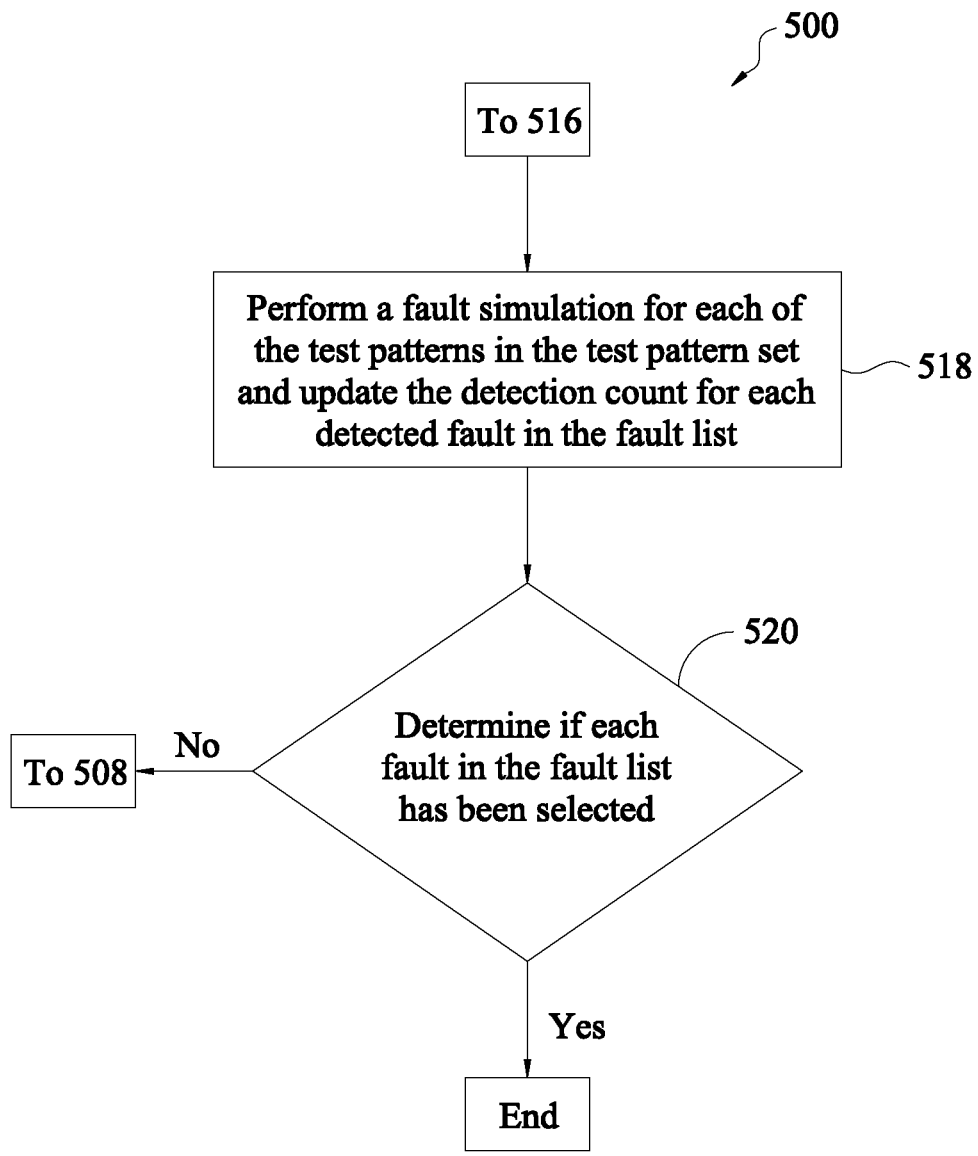
FIG. 5B is a flow chart of a method of generating a test pattern set in a semiconductor device in accordance with some embodiments.

FIGS. 5A-5B are a flow chart of a method 500 of generating a test pattern set in a semiconductor device in accordance with some embodiments. Method 500 is an embodiment of operation 204 shown in FIG. 2. Method 500 begins with operation 502 in which a primary node list and a secondary node list are loaded into a fault detection tool. In some embodiments, the fault detection tool is computer program code in a portion of an EDA tool.

In operation 504, the system for detecting faults in a semiconductor device creates a fault list from the primary node list. The fault list is created from each node in the primary node list.

In operation 506, the system for detecting faults in a semiconductor device marks one or more of the faults in the fault list as untested, sets a detection count for each corresponding fault in the fault list and sets a state list for each corresponding fault in the fault list.

In some embodiments, the system for detecting faults in a semiconductor device marks each fault in the fault list as untested. In some embodiments, the system for detecting faults in a semiconductor device marks each fault in the fault list as undetected. The detection count corresponds to the number of times a fault is detected for each corresponding fault member in the fault list. Each fault member of the fault list is associated with a corresponding detection count. In this exemplary implementation, the detection count for each corresponding fault in the fault list is set equal to zero. The state list includes one or more states. A state corresponds to the value of a secondary node list for each corresponding fault member in the fault list. Each fault member of the fault list is associated with a corresponding state list. The state list for each corresponding fault in the fault list is set equal to zero. In some embodiments, the state list for each corresponding fault in the fault list is equal to an empty set.

In operation 508, the system for detecting faults in a semiconductor device selects a fault from the fault list. A fault from the fault list marked as untested is selected. In some embodiments, the system for detecting faults in a semiconductor device selects a fault from the fault list marked as undetected.

In operation 510, the system for detecting faults in a semiconductor device generates a test pattern to detect at least the selected fault in the fault list. The selected fault is a fault from the fault list marked as undetected. The selected fault is associated with a corresponding current state and a corresponding state list. The system for detecting faults in a semiconductor device generates a test pattern by the use of an automatic test pattern generator (ATPG).

In operation 512, the system for detecting faults in a semiconductor device determines if the generated test pattern affects one or more nodes in the secondary node list for each selected fault in the fault list. If the system for detecting faults in a semiconductor device determines that the generated test pattern affects one or more nodes in the secondary node list for each selected fault in the fault list, the operation proceeds to operation 514. If the system for detecting faults in a semiconductor device determines that the generated test pattern did not affect one or more nodes in the secondary node list for each selected fault in the fault list, the operation proceeds to operation 510. For operation 512, affecting one or more nodes in the secondary node list includes detecting a previously undetected state for the at least one selected fault. In operation 512, determining if the generated test pattern detected a previously undetected state for the at least one selected fault includes determining if the current state is a member of the state list for the at least one selected fault.

In operation 514, the system for detecting faults in a semiconductor device adds the generated test pattern to a test pattern set, adjusts the detection count for each of the corresponding selected faults in the fault list, and adds the current state to the state list for each of the corresponding selected faults in the fault list. The detection count for each of the corresponding selected faults in the fault list is adjusted by incrementing the detection count by an integer, for example, 1.

In operation 516, the system for detecting faults in a semiconductor device determines if the detection count for the corresponding selected fault is less than a first threshold. If the system for detecting faults in a semiconductor device determines that the detection count for the corresponding selected fault is less than the first threshold, the operation proceeds to 510. If the system for detecting faults in a semiconductor device determines that the detection count for the corresponding selected fault is not less than the first threshold, the operation proceeds to 518. In some embodiments, if the system for detecting faults in a semiconductor device determines that the detection count for the corresponding selected fault is not less than the first threshold, then the corresponding selected fault was detected by at least one test pattern. In some embodiments, the first threshold is an integer which ranges from about 1 to about 16. In some embodiments, the first threshold is entered by a user. In some embodiments, the first threshold is adjusted by a user. In some embodiments, operations 510, 512, 514 and 516 repeats until the detection count for the corresponding selected fault is not less than the first threshold.

In operation 518, the system for detecting faults in a semiconductor device performs a fault simulation for each of the test patterns in the test pattern set and updates the detection count for each corresponding detected fault in the fault list. A fault simulation includes the utilization of one or more fault models to test one or more defect types in a semiconductor device. In some embodiments, a fault model includes a line stuck-at fault model, transition fault model, bridging fault model, path delay fault model and similar models.

In operation 520, the system for detecting faults in a semiconductor device determines if each fault in the fault list has been selected. If the system for detecting faults in a semiconductor device determines that each fault in the fault list has not been selected, the operation proceeds to operation 508. If the system for detecting faults in a semiconductor device determines that each fault in the fault list has been selected, the operation ends. In some embodiments, operations 510, 512, 514, 516, 518 and 520 repeats until each fault in the fault list has been selected. In some embodiments, determining if each fault in the fault list has been selected includes determining if each fault in the fault list has been marked as untested. In some embodiments, determining if each fault in the fault list has been selected includes determining if each fault in the fault list has been marked as undetected.

Figure 6:
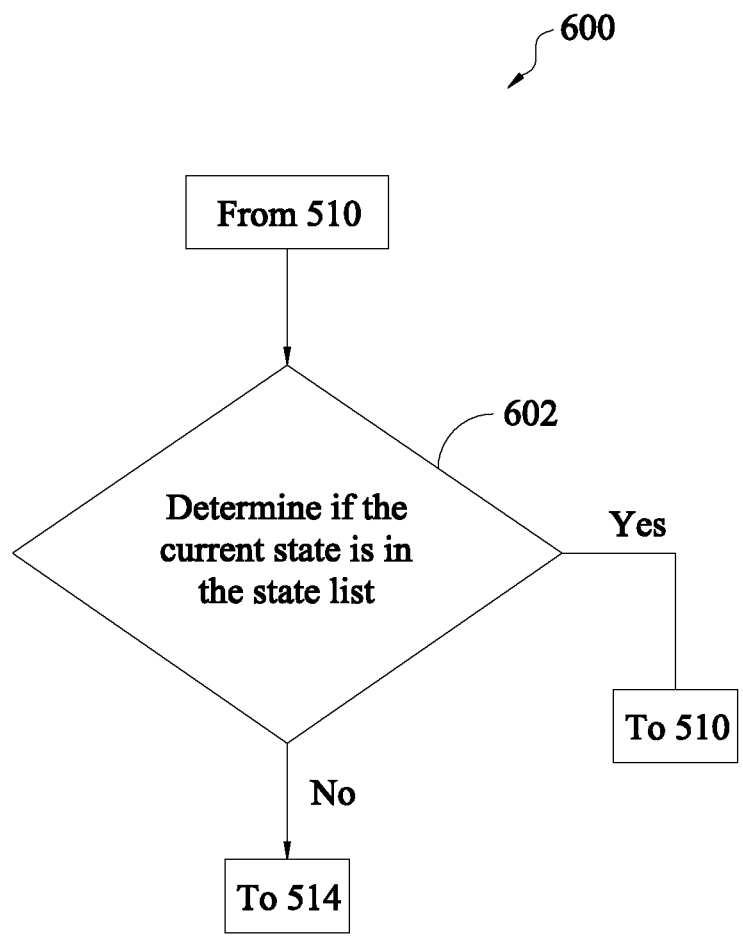
FIG. 6 is a flow chart of a method determining if a selected test pattern affects one or more nodes in the secondary node list in a semiconductor device in accordance with some embodiments.

FIG. 6 is a flow chart of a method 600 of determining if the generated test pattern affects one or more nodes in the secondary node list in a semiconductor device in accordance with some embodiments. Method 600 is an embodiment of operation 512 shown in FIG. 5A. Method 600 begins with operation 602 in which the system for detecting faults in a semiconductor device determines if the current state of the selected fault is a member of the state list for the selected fault. If the system for detecting faults in a semiconductor device determines the current state of the selected fault is a member of the state list for the selected fault, the operation proceeds to operation 510 (shown in FIG. 5A). If the system for detecting faults in a semiconductor device determines the current state of the selected fault is not a member of the state list for the selected fault, the operation proceeds to operation 514 (shown in FIG. 5A). In some embodiments, operation 502 is repeated for each selected fault in the fault list.

Figure 7A:
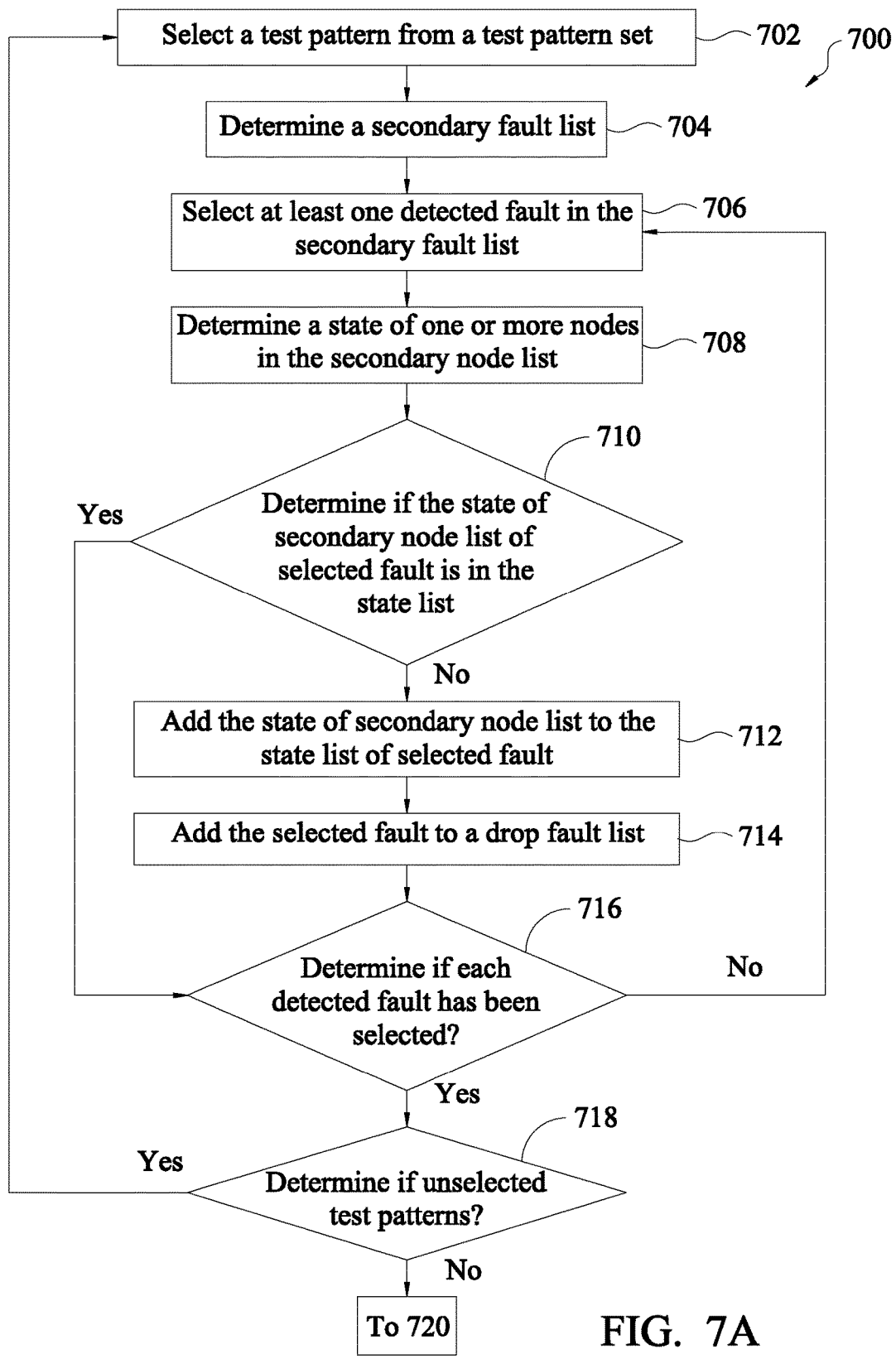
FIG. 7A is a flow chart of a method of performing a fault simulation for each of the test patterns in the test pattern set and updating the detection count for each corresponding detected fault in the fault list in a semiconductor device in accordance with some embodiments.
Figure 7B:
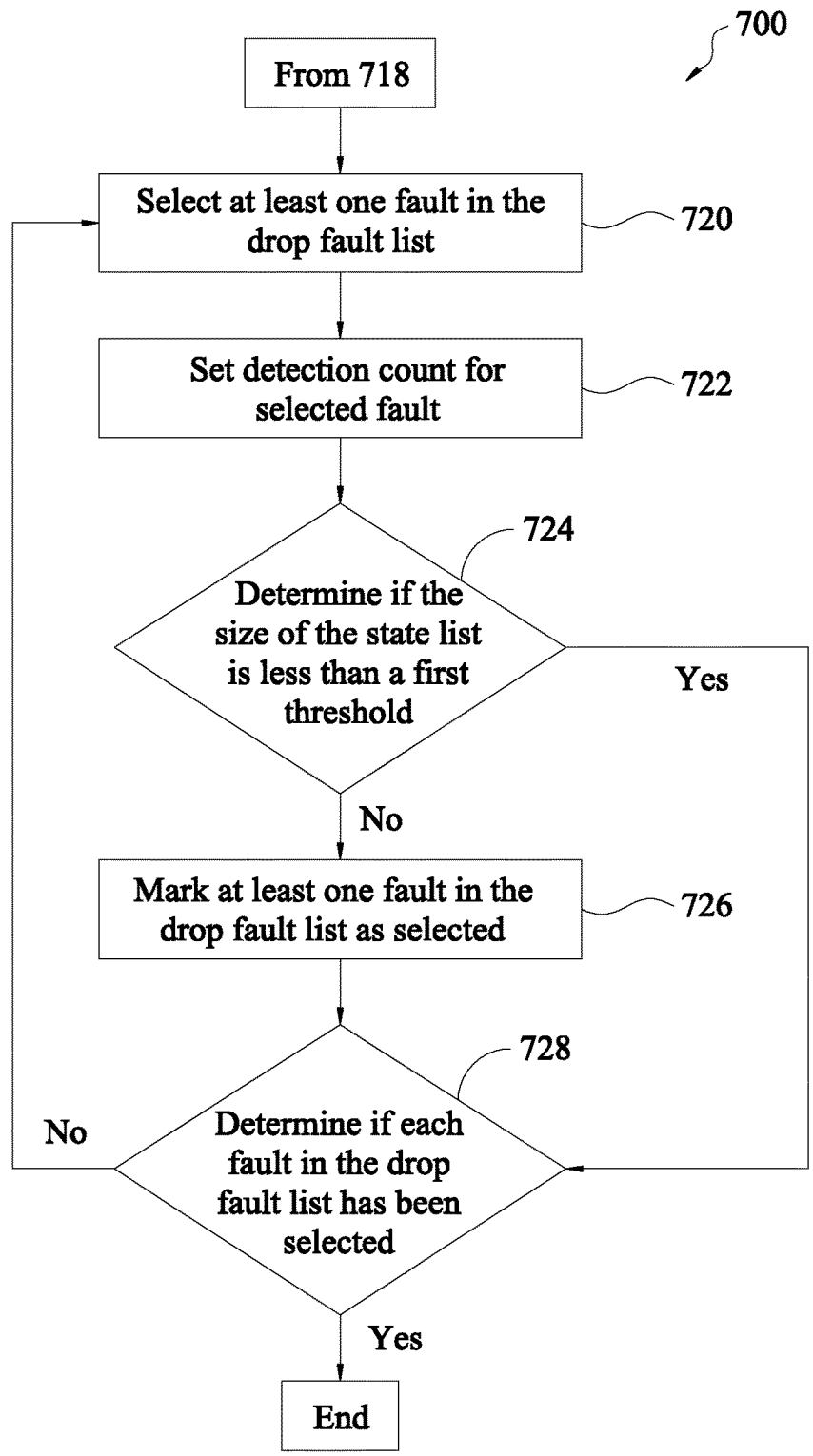
FIG. 7B is a flow chart of a method of performing a fault simulation for each of the test patterns in the test pattern set and updating the detection count for each corresponding detected fault in the fault list in a semiconductor device in accordance with some embodiments.

FIGS. 7A-7B are a flow chart of a method 700 of performing a fault simulation for each of the test patterns in the test pattern set and updating the detection count for each corresponding detected fault in the fault list in a semiconductor device in accordance with some embodiments. Method 700 is an embodiment of operation 518 shown in FIG. 5B. Method 700 begins with operation 702 in which the system for detecting faults in a semiconductor device selects a test pattern from the test pattern set.

In operation 704, the system for detecting faults in a semiconductor device determines a secondary fault list for the corresponding selected test pattern. The secondary fault list includes one or more detected faults in the semiconductor device. In some embodiments, determining a secondary fault list for the selected test pattern and each of the faults in the fault list includes determining one or more faults detected by the corresponding selected test pattern. In some embodiments, determining a secondary fault list for the selected test pattern and each of the faults in the fault list includes performing a fault simulation for the selected test pattern and each of the faults in the fault list.

In operation 706, the system for detecting faults in a semiconductor device selects at least one detected fault in the secondary fault list.

In operation 708, the system for detecting faults in a semiconductor device determines a state of one or more nodes in the secondary node list for each corresponding selected fault in the secondary fault list.

In operation 710, the system for detecting faults in a semiconductor device determines if the state of one or more nodes in the secondary node list for the corresponding selected fault in the secondary fault list is a member of the state list for the corresponding selected fault in the secondary fault list. If the system for detecting faults in a semiconductor device determines the state of the secondary node list for the corresponding selected fault is a member of the state list for the corresponding selected fault, the operation proceeds to operation 716. If the system for detecting faults in a semiconductor device determines the state of the secondary node list for the corresponding selected fault is not a member of the state list for the corresponding selected fault, the operation proceeds to operation 712.

In operation 712, the system for detecting faults in a semiconductor device adds the state of the secondary node list for the corresponding selected fault to the state list for the corresponding selected fault.

In operation 714, the system for detecting faults in a semiconductor device adds the selected fault of the secondary fault list to a drop fault list. A drop fault list includes one or more dropped faults.

In operation 716, the system for detecting faults in a semiconductor device determines if each detected fault in the secondary fault list has been selected. If the system for detecting faults in a semiconductor device determines that each detected fault in the secondary fault list has not been selected, the operation proceeds to operation 706. If the system for detecting faults in a semiconductor device determines that each detected fault in the secondary fault list has been selected, the operation proceeds to operation 718.

In operation 718, the system for detecting faults in a semiconductor device determines if there are unselected test patterns in the test pattern set. If the system for detecting faults in a semiconductor device determines that there are unselected test patterns in the test pattern set, the operation proceeds to operation 702. If the system for detecting faults in a semiconductor device determines that there are not unselected test patterns in the test pattern set, the operation proceeds to operation 720.

In operation 720, the system for detecting faults in a semiconductor device selects at least one fault in the drop fault list.

In operation 722, the system for detecting faults in a semiconductor device sets a detection count for the corresponding selected fault in the drop fault list. Each detection count is associated with a corresponding selected fault member of the drop fault list. In some embodiments, the detection count for the corresponding selected fault in the drop fault list is set equal to the size of the state list for the selected fault.

In operation 724, the system for detecting faults in a semiconductor device determines if the size of the state list for the corresponding selected fault in the drop fault list is less than a first threshold. The size of the state list corresponds to the number of entries in the state list. If the system for detecting faults in a semiconductor device determines that the size of the state list for the corresponding selected fault in the drop fault list is less than a first threshold, the operation proceeds to 728. If the system for detecting faults in a semiconductor device determines the size of the state list for the corresponding selected fault in the drop fault list is not less than a first threshold, the operation proceeds to 726.

In operation 726, the system for detecting faults in a semiconductor device marks the selected fault in the drop fault list as tested. In some embodiments, the system for detecting faults in a semiconductor device marks the selected fault in the drop fault list as detected.

In operation 728, the system for detecting faults in a semiconductor device determines if each fault in the drop fault list has been selected. If the system for detecting faults in a semiconductor device determines that each fault in the drop fault list has not been selected, the operation proceeds to operation 720. If the system for detecting faults in a semiconductor device determines that each fault in the drop fault list has been selected, the operation ends.

Figure 8:
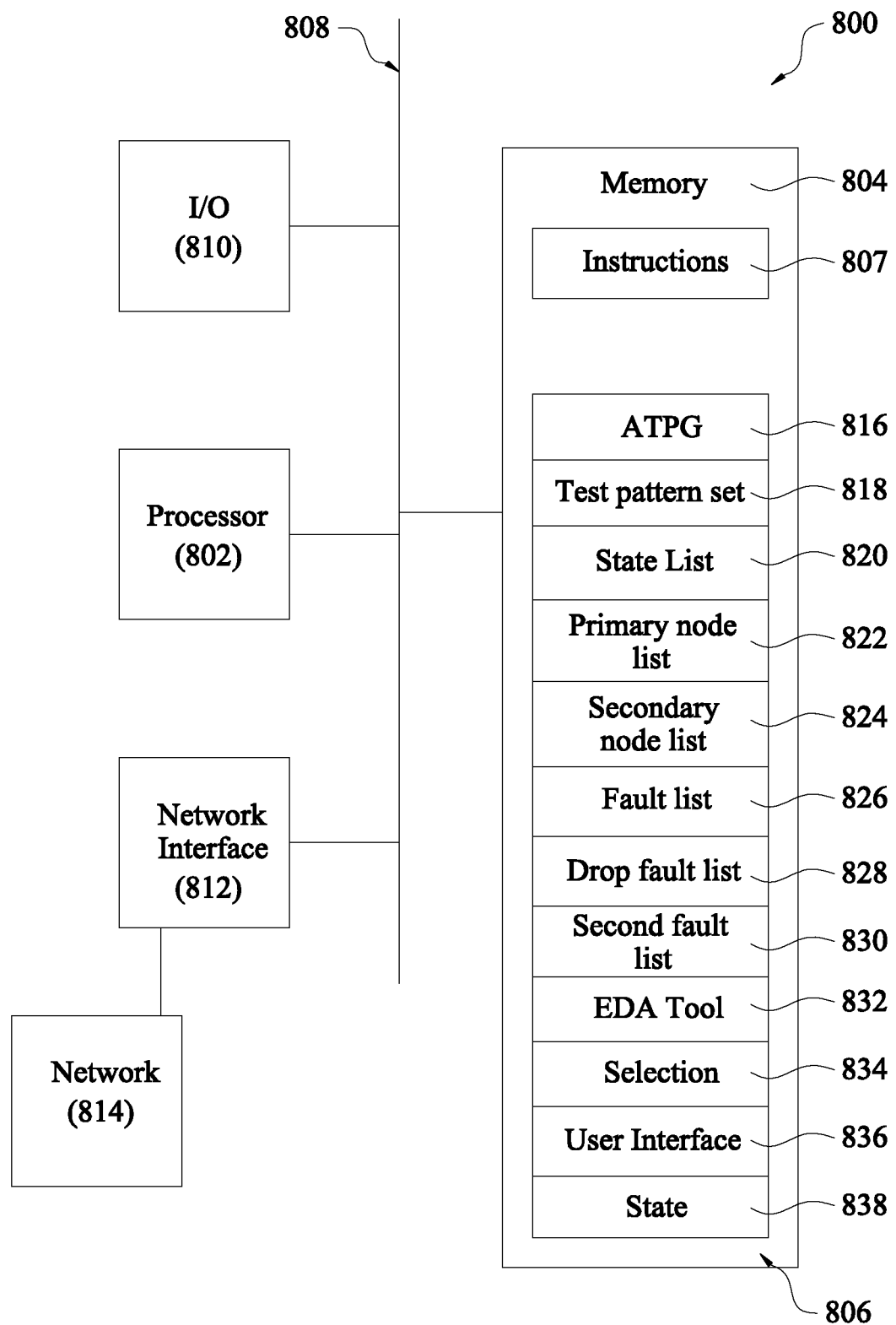
FIG. 8 is a block diagram of a control system for detecting faults in a semiconductor device in accordance with one or more embodiments.

FIG. 8 is a block diagram of a control system 800 for detecting faults in a semiconductor device in accordance with one or more embodiments. In some embodiments, the control system 800 is a general purpose computing device which implements method 200 of FIG. 2, method 300 of FIGS. 3A-3B, method 400 of FIG. 4, method 500 of FIG. 5A, method 600 of FIG. 6 or method 700 of FIG. 7 in accordance with one or more embodiments. Control system 800 includes a hardware processor 802 and a non-transitory, computer readable storage medium 804 encoded with, i.e., storing, the computer program code 806, i.e., a set of executable instructions. Computer readable storage medium 804 is also encoded with instructions 807 for interfacing with manufacturing machines for producing the semiconductor device. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 encoded in the computer readable storage medium 804 in order to cause system 800 to be usable for performing a portion or all of the operations as described e.g., in method 200, 300, 400, 500, 600 or 700.

In one or more embodiments, the processor 802 is a central processing unit (CPU), a multi-processor, a distributed processing system, an application specific integrated circuit (ASIC), and/or a suitable processing unit.

In one or more embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium 804 includes a compact disk-read only memory (CD-ROM), a compact disk-read/write (CD-R/W), and/or a digital video disc (DVD).

In one or more embodiments, the storage medium 804 stores the computer program code 806 configured to cause system 800 to perform method 200, 300, 400, 500, 600 or 700. In one or more embodiments, the storage medium 804 also stores information needed for performing method 200, 300, 400, 500, 600 or 700 as well as information generated during performing method 200, 300, 400, 500, 600 or 700, such as automatic test pattern generator (ATPG) 816, test pattern set 818, second test pattern set 820, primary node list 822, secondary node list 824, fault list 826, drop fault list 828, second fault list 830, EDA Tool 832, selection 834, user interface (UI) 836, state 838 and/or a set of executable instructions to perform the operation of method 200, 300, 400, 500, 600 or 700. In some embodiments, UI 836 is a graphical user interface (GUI).

In one or more embodiments, the storage medium 804 stores instructions 807 for interfacing with external machines. The instructions 807 enable processor 802 to generate instructions readable by the external machines to effectively implement method 200, 300, 400, 500, 600 or 700 during a design process. In some embodiments, the design process is of a semiconductor device including one or more circuit elements. In some embodiments, the design process includes a fault testing process. The instructions 807 enable processor 802 to generate instructions readable by the external machines to effectively implement method 200, 300, 400, 500, 600 or 700 during a fault testing process.

Control system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

Control system 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1394. In one or more embodiments, method 200, 300, 400, 500, 600 or 700 are implemented in two or more systems 800, and information such as ATPG 816, test pattern set 818, state list 820, primary node list 822, secondary node list 824, fault list 826, drop fault list 828, second fault list 830, EDA Tool 832, selection 834, UI 836, state 838 are exchanged between different systems 800 via network 814.

System 800 is configured to receive information related to an ATPG through I/O interface 810. The information is transferred to processor 802 via bus 808 to generate ATPG. The ATPG is then stored in computer readable medium 804 as ATPG 816. Control system 800 is configured to receive information related to a test pattern set through I/O interface 810. The information is stored in computer readable medium 804 as test pattern set 818. Control system 800 is configured to receive information related to a state list through I/O interface 810. The information is stored in computer readable medium 804 as state list 820. Control system 800 is configured to receive information related to a primary node list through I/O interface 810. The information is stored in computer readable medium 804 as primary node list 822. Control system 800 is configured to receive information related to a secondary node list through I/O interface 810. The information is stored in computer readable medium 804 as secondary node list 824. Control system 800 is configured to receive information related to a fault list through I/O interface 810. The information is stored in computer readable medium 804 as fault list 826. Control system 800 is configured to receive information related to a drop fault list through I/O interface 810. The information is stored in computer readable medium 804 as drop fault list 828. Control system 800 is configured to receive information related to a second fault list through I/O interface 810. The information is stored in computer readable medium 804 as second fault list 830. Control system 800 is configured to receive information related to an EDA Tool through I/O interface 810. The information is stored in computer readable medium 804 as EDA Tool 832. Control system 800 is configured to receive information related to a selection through I/O interface 810. The information is stored in computer readable medium 804 as selection 834. Control system 800 is configured to receive information related to a UI through I/O interface 810. The information is stored in computer readable medium 804 as UI 836. Control system 800 is configured to receive information related to a state through I/O interface 810. The information is stored in computer readable medium 804 as state 838.

In some embodiments, the implementation shown in FIGS. 2-8 provides an environment for detecting one or more faults in a semiconductor device. In some embodiments, the test pattern set includes one or more test patterns based on the secondary node list. In some embodiments, the implementation of method 200, 300, 400, 500, 600 or 700 includes one or more test patterns that detect faults where a large defect density is observed in the semiconductor device when compared with other regions (e.g., lower defect density regions). In some embodiments, the implementation of method 200, 300, 400, 500, 600 or 700 targets regions of the semiconductor device where clustered defects are observed in neighbor nodes. In some embodiments, the implementation of method 200, 300, 400, 500, 600 or 700 includes one or more test patterns based on neighborhood excitation and propagation. In some embodiments, the implementation of method 200, 300, 400, 500, 600 or 700 includes a test pattern set that is correlated to one or more test patterns based on the neighbor nodes contained in each secondary node list.

In some embodiments, method 200, 300, 400, 500, 600 or 700 is implemented as a standalone software application for execution by a processor. In some embodiments, method 200, 300, 400, 500, 600 or 700 is implemented as a software application that is a part of an additional software application. In some embodiments, method 200, 300, 400, 500, 600 or 700 is implemented as a plug-in to a software application. In some embodiments, method 200, 300, 400, 500, 600 or 700 is implemented as a software application that is a portion of an EDA tool. In some embodiments, method 200, 300, 400, 500, 600 or 700 is implemented as a software application that is used by an EDA tool. In some embodiments, the EDA tool is used to generate a layout of the semiconductor device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design.

One of ordinary skill in the art would recognize that operations are able to be removed or that additional operations are able to be added to method 200, 300, 400, 500, 600 or 700 without departing from the scope of this description. One of ordinary skill in the art would also recognize that an order of operations in method 200, 300, 400, 500, 600 or 700 is able to be adjusted without departing from the scope of this description.

One aspect of this description relates to a method of detecting one or more faults in a semiconductor device. The method includes generating one or more secondary node lists from a primary node list. The primary node list includes one or more nodes. Each node of the one or more nodes of the primary node list is associated with a corresponding secondary node list of the one or more secondary node lists. The method also includes generating a test pattern set from the secondary node list and a fault list. The fault list identifies the one or more faults.

Another aspect of this description relates to a system for detecting one or more faults in a semiconductor device. The system includes at least one processor and at least one memory including computer program code for one or more programs, the at least one memory and the computer program code being configured to, with the at least one processor, cause the system to generate one or more secondary node lists from a primary node list and generate a test pattern set from at least the secondary node list and a fault list. Further, the primary node list includes one or more nodes. Also, each node of the one or more nodes of the primary node list is associated with a corresponding secondary node list of the one or more secondary node lists. The test pattern set includes one or more generated test patterns. The fault list identifies the one or more faults.

Still another aspect of this description relates to a computer readable medium including at least computer executable instructions for carrying out a method for testing a semiconductor device. The method includes generating one or more secondary node lists from a primary node list and generating a test pattern set from at least the secondary node list and a fault list. Further, the primary node list includes one or more nodes. Also, each node of the one or more nodes of the primary node list is associated with a corresponding secondary node list of the one or more secondary node lists. The test pattern set includes one or more generated test patterns. The fault list identifies the one or more faults.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of detecting one or more faults in a semiconductor device, the method comprising:
generating one or more secondary node lists from a primary node list, wherein the primary node list comprises one or more nodes, wherein each node of the one or more nodes of the primary node list is associated with a corresponding secondary node list of the one or more secondary node lists, and wherein generating one or more secondary node lists from the primary node list comprises:
selecting a node from the primary node list, and
enclosing a physical location of the selected node with a predetermined drawing shape; and
generating a test pattern set from the secondary node list and a fault list, wherein the fault list identifies the one or more faults.

2. The method of claim 1, wherein each test pattern of the one or more test patterns comprises one or more ordered lists of inputs to the semiconductor device and one or more ordered lists of expected outputs of the semiconductor device, wherein each ordered list of inputs of the one or more ordered lists of inputs corresponds to each ordered list of expected outputs of the one or more ordered lists of expected outputs.

3. The method of claim 1, wherein each secondary node list of the one or more secondary node lists comprises one or more adjacent nodes from the primary node list.

4. The method of claim 1, wherein generating one or more secondary node lists comprises
adding the selected node or one or more determined nodes of the primary node list within a predetermined distance of the selected node to the secondary node list for the corresponding selected node.

5. The method of claim 1, wherein generating one or more secondary node lists comprises:
determining one or more nodes in the primary node list enclosed by the predetermined drawing shape; and
adding the selected node or one or more determined nodes of the primary node list to the secondary node list for the corresponding selected node when the one or more determined nodes are enclosed by the predetermined drawing shape.

6. The method of claim 1, wherein the predetermined drawing shape is chosen from polygons, circles, and ellipses.

7. The method of claim 1, wherein the predetermined drawing shape is arranged to cause an adjustment of a shape of the predetermined drawing shape.

8. The method of claim 1, wherein the predetermined drawing shape is arranged to cause an adjustment of a size of the predetermined drawing shape.

9. A system for detecting one or more faults in a semiconductor device, comprising:
at least one processor; and
at least one memory including computer program code for one or more programs, the at least one memory and the computer program code being configured to, with the at least one processor, cause the system to:
generate one or more secondary node lists from a primary node list, wherein the primary node list comprises one or more nodes, wherein each node of the one or more nodes of the primary node list is associated with a corresponding secondary node list of the one or more secondary node lists,
select a node from the primary node list,
enclose a physical location of the selected node with a predetermined drawing shape, and
generate a test pattern set from the secondary node list and a fault list, wherein the test pattern set comprises one or more generated test patterns, and wherein the fault list identifies the one or more faults.

10. The system of claim 9, wherein the computer program code to cause the system to generate one or more secondary node lists comprises computer program code to cause the system to:
determine one or more nodes in the primary node list enclosed by the predetermined drawing shape; and
add the selected node or one or more determined nodes of the primary node list to the secondary node list for the corresponding selected node when the one or more determined nodes are enclosed by the predetermined drawing shape.

11. The system of claim 9, wherein each test pattern of the one or more test patterns is arranged to cause the detection of at least one fault from the fault list.

12. The system of claim 9, wherein the computer program code to cause the system to generate the test pattern set comprises computer program code to cause the system to:
generate at least one test pattern to detect at least the selected fault from the fault list; and
add the generated test pattern to the test pattern set, for each of the generated test patterns of the test pattern set that affect one or more nodes in the secondary node list for each selected fault in the fault list.

13. The system of claim 12, wherein the computer program code to cause the system to generate the test pattern set further comprises computer program code to cause the system to perform a fault simulation for each of the generated test patterns of the test pattern set and to update a detection count for each corresponding selected fault in the fault list, wherein each detection count is associated with a corresponding selected fault member of the fault list.

14. The system of claim 12, further comprising computer program code to cause the system to add the generated test patterns to the test pattern set, for each of the generated test patterns of the test pattern set that detect an undetected state for each selected fault in the fault list.

15. A non-transitory computer readable medium comprising computer executable instructions for carrying out a method of testing a semiconductor device, the method comprising:
generating one or more secondary node lists from a primary node list, wherein the primary node list comprises one or more nodes, wherein each node of the one or more nodes of the primary node list is associated with a corresponding secondary node list of the one or more secondary node lists;
generating a test pattern set from the secondary node list and a fault list, wherein the test pattern set comprises one or more generated test patterns, and wherein the fault list comprises one or more faults;
selecting a node from the primary node list; and
enclosing a physical location of the selected node with a predetermined drawing shape.

16. The non-transitory computer readable medium of claim 15, wherein generating the test pattern set comprises:
selecting at least one fault from the fault list;
generating at least one test pattern which detects at least the selected fault from the fault list;
adding the generated test pattern to the test pattern set, for each of the generated test patterns of the test pattern set that affect one or more nodes in the secondary node list for each selected fault in the fault list; and
performing a fault simulation for each of the generated test patterns of the test pattern set and updating a first detection count for each corresponding selected fault in the fault list, wherein each first detection count is associated with a corresponding selected fault member of the fault list.

17. The non-transitory computer readable medium of claim 16, wherein performing the fault simulation comprises:
selecting at least one test pattern from the test pattern set; and
determining a secondary fault list for each of the corresponding selected test patterns, wherein the secondary fault list comprises one or more detected faults, and wherein each selected test pattern is associated with the one or more detected faults in the corresponding secondary fault list.

18. The non-transitory computer readable medium of claim 17, wherein performing the fault simulation further comprises:
selecting at least one detected fault in the secondary fault list; and
determining a state of one or more nodes in the secondary node list for each selected fault in the secondary fault list, wherein each node of the one or more nodes in the secondary node list is associated with a corresponding state.

19. The non-transitory computer readable medium of claim 18, wherein performing the fault simulation further comprises:
adding the state of each secondary node list for each corresponding selected fault in the secondary fault list to a state list for each of the corresponding selected faults in the secondary fault list, and adding each selected fault of the secondary fault list to a drop fault list, wherein the drop fault list comprises one or more dropped faults.

20. The non-transitory computer readable medium of claim 19, wherein performing the fault simulation further comprises:
- selecting at least one fault in the drop fault list;
- setting a second detection count for each corresponding selected fault in the drop fault list, wherein each second detection count is associated with a corresponding selected fault member of the drop fault list; and
- marking each selected fault in the drop fault list, for each selected fault in the drop fault list with a corresponding state list size that is not less than a first threshold, wherein each state list is associated with a corresponding state list size.

* * * * *